US010931273B1

(12) United States Patent
Panaite et al.

(10) Patent No.: US 10,931,273 B1
(45) Date of Patent: Feb. 23, 2021

(54) CIRCUIT FOR CONTROLLING A SWITCHING DEVICE TO DELIVER POWER TO A LOAD

(71) Applicant: Infineon Technologies AG, Neubiberg (DE)

(72) Inventors: Dragos Panaite, Bucharest (RO); Ansgar Pottbäcker, Grafing (DE); Ioan Vasiliu, Hartop (RO); Ramona-Bianca Neagu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/779,060

(22) Filed: Jan. 31, 2020

(51) Int. Cl.
H03K 17/10 (2006.01)
H03K 17/687 (2006.01)

(52) U.S. Cl.
CPC .......... H03K 17/102 (2013.01); H03K 17/687 (2013.01)

(58) Field of Classification Search
CPC ..................... H03K 17/102; H03K 17/687
USPC .... 327/108–112, 427, 434, 437; 326/82, 83, 326/87
See application file for complete search history.

(56) References Cited

U.S. PATENT DOCUMENTS

| 8,376,943 | B2 | 2/2013 | Kovach et al. |
| 9,610,445 | B2 | 4/2017 | Thakur et al. |
| 9,770,584 | B2 | 9/2017 | Thakur et al. |
| 2005/0021091 | A1 | 1/2005 | Laske et al. |
| 2011/0144508 | A1 | 6/2011 | Blomqvist et al. |
| 2013/0063188 | A1* | 3/2013 | Sogo .................. H03K 17/0828 327/109 |
| 2015/0249407 | A1 | 9/2015 | Park et al. |
| 2017/0281095 | A1 | 10/2017 | An et al. |
| 2018/0269869 | A1 | 9/2018 | Mukhopadhyay et al. |

(Continued)

FOREIGN PATENT DOCUMENTS

| EP | 1491234 B1 | 2/2008 |
| KR | 101916795 B1 | 11/2018 |

OTHER PUBLICATIONS

Merello, "Application Note AN-1123, Bootstrap Network Analysis: Focusing on the Integrated Bootstrap Functionality," International Rectifier, retrieved from https://www.infineon.com/dgdl/Infineon-Bootstrap_Network_Analysis-AN-v01_00-EN.pdf?fileId=5546d462533600a40153559692661096, on Dec. 12, 2019, 21 pp.

Primary Examiner — Tomi Skibinski
(74) Attorney, Agent, or Firm — Shumaker & Sieffert, P.A.

(57) ABSTRACT

This disclosure includes systems, methods, and techniques for controlling delivery of power to a load. For example, a circuit includes a first switching device and a second switching device. The circuit is configured to activate, in response to a source voltage of a semiconductor device being lower than a first voltage, the first switching device in order to cause the circuit to deliver a first electrical signal to the semiconductor device, where the first electrical signal includes the first voltage and deactivate the first switching device in response to the source voltage of the semiconductor device not being lower than the first voltage. Additionally, the circuit is configured to activate, in response to the source voltage of the semiconductor device not being lower than the first voltage, the second switching device to cause the circuit to deliver a second electrical signal to the semiconductor device.

29 Claims, 8 Drawing Sheets

(56) References Cited

U.S. PATENT DOCUMENTS

2019/0329043 A1    10/2019  Sharma
2019/0356149 A1*   11/2019  Li .......................... H02M 7/219
2019/0388692 A1    12/2019  Dinsmoor et al.

* cited by examiner

… … …

CIRCUIT FOR CONTROLLING A SWITCHING DEVICE TO DELIVER POWER TO A LOAD

TECHNICAL FIELD

This disclosure relates to circuits for controlling current across semiconductor devices.

BACKGROUND

Driver circuits are often used to control a voltage, current, or power at a load. For instance, a set of semiconductor devices may provide an electrical signal to a load, such as an electric motor. The set of semiconductor devices may include one or more high-side semiconductor devices which are between a power source and a load and one or more low-side semiconductor devices which are between the load and ground. Gate driver circuits, in some cases, may control the set of semiconductor devices by delivering electrical signals to respective gate terminals of the set of semiconductor devices.

SUMMARY

In general, this disclosure is directed to devices, systems, and techniques for controlling one or more semiconductor devices to deliver power to a load. For example, a set of circuits may control a set of semiconductor devices, where each circuit of the set of circuits controls a respective semiconductor device of the set of semiconductor devices. The set of semiconductors may deliver power to a load, such as an electric motor. The set of semiconductor devices may include one or more "high-side" semiconductor devices which are located between a power source and the load and one or more "low-side" semiconductor devices which are located between the load and ground. The set of semiconductor devices may be activated and/or deactivated by the circuits in order to control a manner in which the load operates. In one or more examples where the load represents an electric motor (e.g., a brushless direct current electric motor (BLDC)), the set of circuits may activate and/or deactivate any one or combination of the set of semiconductor devices in order to cause the electric motor to operate in one or more phases of a set of phases.

In some examples, a circuit controls a semiconductor device, the circuit including a first switching device and a second switching device. The circuit is configured to activate, in response to a source voltage of the semiconductor device being lower than a first voltage, the first switching device in order to cause the circuit to deliver a first electrical signal to the semiconductor device, where the first electrical signal includes the first voltage and deactivates the first switching device in response to the source voltage of the semiconductor device not being lower than the first voltage. Additionally, the circuit is configured to activate, in response to the source voltage of the semiconductor device not being lower than the first voltage, the second switching device to cause the circuit to deliver a second electrical signal to the semiconductor device, where the second electrical signal includes a second voltage which is different from the first voltage and deactivate the second switching device in response to the source voltage of the semiconductor device being lower than the first voltage.

In some examples, a method includes activating, by a circuit in response to a source voltage of a semiconductor device being lower than a first voltage, a first switching device in order to cause the circuit to deliver a first electrical signal to the semiconductor device, where the first electrical signal includes the first voltage and deactivating, by the circuit, the first switching device in response to the source voltage of the semiconductor device not being lower than the first voltage. Additionally, the method includes activating, by the circuit in response to the source voltage of the semiconductor device not being lower than the first voltage, a second switching device to cause the circuit to deliver a second electrical signal to the semiconductor device, where the second electrical signal includes a second voltage which is different from the first voltage and deactivating, by the circuit, the second switching device in response to the source voltage semiconductor device being lower than the first voltage.

In some examples, a system includes a semiconductor device including a gate, where the semiconductor device is configured to receive, from a power source, a power source signal including a power source voltage and a circuit including a first switching device and a second switching device. The circuit is configured to activate, in response to a source voltage of the semiconductor device being lower than a first voltage, the first switching device in order to cause the circuit to deliver a first electrical signal to the gate of the semiconductor device, where the first electrical signal includes the first voltage and deactivate the first switching device in response to the source voltage of the semiconductor device not being lower than the first voltage. Additionally, the circuit is configured to activate, in response to the source voltage of the semiconductor device not being lower than the first voltage, the second switching device to cause the circuit to deliver a second electrical signal to the gate of the semiconductor device, where the second electrical signal includes a second voltage which is different from the first voltage and deactivate the second switching device in response to the source voltage of the semiconductor device being lower than the first voltage.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

Some systems may use a set of gate driver circuits to control any one or combination of a set of semiconductor devices to deliver power to a load. In some examples, the load may represent an electric motor configured to operate according to one or more phases. The phase of the electric motor may depend on which semiconductor devices of the set of semiconductor devices are in an activated state. In some cases, each gate driver circuit of the set of gate driver circuits are configured to drive a gate terminal of a respective semiconductor device without the aid of a boot-strap capacitor external to the gate driver circuit. For example, a gate driver circuit may alternate between supplying a first electrical signal and a second electrical signal to a gate terminal of a semiconductor device in order to ensure that the gate driver circuit may adequately control the gate in circumstances when a voltage magnitude of the electrical signal travelling across the semiconductor device is greater than or equal to a voltage magnitude of the first electrical signal.

Figure 1:
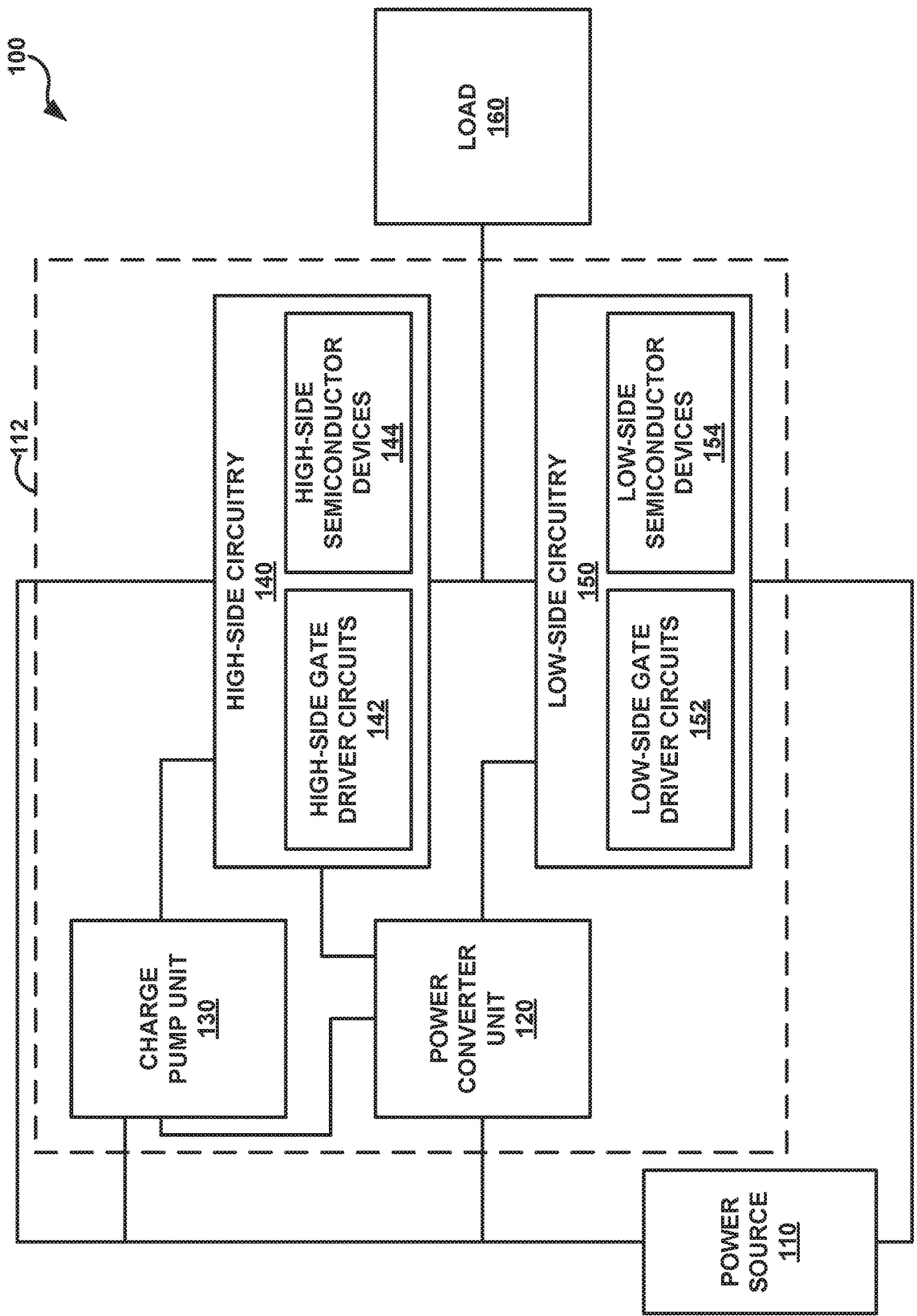
FIG. 1 is a block diagram illustrating an exemplary system for delivering power from a power source to a load, in accordance with one or more techniques of this disclosure.

FIG. 1 is a block diagram illustrating an exemplary system 100 for delivering power from a power source 110 to a load 160, in accordance with one or more techniques of this disclosure. As illustrated in the example of FIG. 1, system 100 includes power source 110, circuit 112, and load 160. Circuit 112 includes power converter unit 120, charge pump unit 130, high-side circuitry 140, and low-side circuitry 150. High-side circuitry 140 includes high-side gate driver circuits 142 and high-side semiconductor devices 144. Low-side circuitry 150 includes low-side gate driver circuits 152 and low-side semiconductor devices 154.

Power source 110 is configured to deliver operating power to circuit 112. In some examples, power source 110 includes a battery and a power generation circuit to produce operating power. In some examples, power source 110 is rechargeable to allow extended operation. Power source 110 may include any one or more of a plurality of different battery types, such as nickel cadmium batteries and lithium ion batteries. In some examples, a maximum voltage output of power source 110 is approximately 12V. In some examples, power source 110 supplies power within a range from 10 Watts (W) to 15 W.

Circuit 112 may include circuit elements including resistors, capacitors, inductors, diodes, semiconductor switches, and other semiconductor elements. As illustrated in FIG. 1, circuit 112 includes power converter unit 120, charge pump unit 130. Power source 110 may supply an input signal (e.g., a power source signal) to power converter unit 120, charge pump unit 130, and high-side circuitry 140, thus, powering circuit 112. Furthermore, power converter unit 120 may generate, using the power source signal, a first electrical signal including a first voltage and a first current. Power converter unit 120 may provide at least a portion of a first electrical signal to charge pump unit 130. Additionally, or alternatively, power converter unit 120 may provide at least a portion of the first electrical signal to one or both of high-side circuitry 140 and low-side circuitry 150. The power source signal, in some cases, may include power source current and a power source voltage.

In some cases, power converter unit 120 represents a DC-to-DC power converter configured to regulate one or more parameters (e.g., the first current and the first voltage) of the first electrical signal delivered to charge pump unit 130, high-side circuitry 140, low-side circuitry 150, or any combination thereof. In some examples, the DC-to-DC power converter includes a switch/inductor unit such as an H bridge. An H bridge uses a set of switches, often semiconductor switches, to convert electrical power. In some examples, the switch/inductor unit acts as a buck-boost converter. For instance, a buck-boost converter is configured to regulate an output voltage using at least two operational modes including a buck mode and a boost mode.

In one or more examples where power converter unit 120 represents a buck-boost converter, power converter unit 120 may control semiconductor switches of the buck-boost converter to alternate the mode of the buck-boost converter (e.g., change the operation mode of the buck-boost converter from buck mode to boost mode and vice versa). Power converter unit 120 may operate in boost mode in response to the power source voltage of the power source signal delivered by power source 110 being lower than a first threshold power source voltage. Additionally, in some cases, power converter unit 120 may operate in buck mode in response to the power source voltage being greater than a second threshold power source voltage. In some examples, power converter unit 120 may operate in one of a group of three modes based on the power source voltage. The group of three modes may include the boost mode when the power source voltage is within a range from 8 Volts (V) to 15 V, the buck mode when the power source voltage is within a range from 30 V to 70V, and a hybrid mode when the power source voltage is within a range from 15V to 30V.

In the example illustrated in FIG. 1, the semiconductor switches of power converter unit 120 may include transistors, diodes, or other semiconductor elements. In buck mode, the buck-boost converter of power converter unit 120 may step down the power source voltage and step up the power source current to generate the first electrical signal output from power converter unit 120. In boost mode, the buck-boost converter of power converter unit 120 may step up the power source voltage and step down the power source current to generate the first electrical signal output from power converter unit 120. In some examples, power converter unit 120 is configured to regulate the first current and the first voltage of the first electrical signal such that the first current and the first voltage remain substantially constant. In some examples, the power converter unit 120 may regulate the first voltage of the first electrical signal to be a constant voltage value within a range from 16V to 20V. In some examples, the power converter unit 120 may regulate the first voltage of the first electrical signal to be 18V.

Charge pump unit 130, in some examples, may include one or more capacitors which store charge in order to raise or lower voltage from an ingress point to an egress point of charge pump unit 130. In this way, charge pump unit 130 may be a power converter which accepts an input electrical signal and generates an output electrical signal having different parameter values than the input electrical signal. In some examples, charge pump unit 130 may receive at least a portion of the first electrical signal from power converter unit 120. Additionally, in some examples, charge pump unit 130 may receive the power source signal from power source 110. In turn, charge pump unit 130 may generate a second electrical signal including a second voltage and a second current. In some examples, charge pump unit 130 may deliver the second electrical signal to high-side circuitry 140. Charge pump unit 130 may boost a voltage of received electrical signals to generate the second electrical signal.

In some examples, charge pump unit 130 represents a Dickson charge pump including one or more "stages", where each stage of the one or more stages corresponds to a factor of multiplication in a voltage of the input electrical signal to charge pump unit 130. In some examples, charge pump unit 130 represents another variety of charge pump. In some examples, charge pump unit 130 includes one stage and charge pump unit 130 multiplies a voltage of the input electrical signal by a factor of two. In some examples, charge pump unit 130 includes two stages and charge pump unit 130 multiplies a voltage of the input electrical signal by a factor of three. In some examples, charge pump unit 130 includes three stages and charge pump unit 130 multiplies a voltage of the input electrical signal by a factor of four. As such, each additional stage included in charge pump unit 130 represents an additional factor of multiplication in the voltage of an electrical signal passing through charge pump unit 130.

High-side circuitry 140 includes high-side gate driver circuits 142 and high-side semiconductor devices 144 and low-side circuitry 150 includes low-side gate driver circuits 152 and low-side semiconductor devices 154. Circuit 112 may control the high-side semiconductor devices 144 and the low-side semiconductor devices 154 (collectively, "semiconductor devices 144, 154) in order to deliver power to load 160 from power source 110. In some examples, a number of high-side semiconductor devices 144 may be the same as a number of low-side semiconductor devices 154. For examples, each high-side semiconductor device of high-side semiconductor devices 144 may be paired with a respective low-side semiconductor device of the set of low-side semiconductor devices 154. Each pair of a low-side semiconductor device and a high-side semiconductor device may control power delivered to a respective input of a set of inputs to load 160. In some examples, load 160 may represent an electric motor, such as a brushless direct current (BLDC) motor including an input corresponding to each operational phase of the electric motor. In the case where load 160 represents a BLDC motor, load 160 includes three inputs, where each input corresponds to a respective phase of the three phases of a BLDC motor.

Each semiconductor device of semiconductor devices 144, 154 may, in some cases, include power switches such as, but not limited to, any type of field-effect transistor (FET) including any one or combination of metal-oxide-semiconductor field-effect transistors (MOSFETs), bipolar junction transistors (BJTs), insulated-gate bipolar transistors (IGBTs), junction field effect transistors (JFETs), high electron mobility transistors (HEMTs), or other elements that use voltage for control. Additionally, semiconductor devices 144, 154 may include n-type transistors, p-type transistors, and power transistors, or any combination thereof. In some examples, semiconductor devices 144, 154 include vertical transistors, lateral transistors, and/or horizontal transistors. In some examples, semiconductor devices 144, 154 include other analog devices such as diodes and/or thyristors. In some examples, semiconductor devices 144, 154 may operate as switches and/or as analog devices.

In some examples, each of semiconductor devices 144, 154 include three terminals: two load terminals and a control terminal. For MOSFET switches, each of semiconductor devices 144, 154 may include a drain terminal, a source terminal, and at least one gate terminal, where the control terminal is a gate terminal. For BJT switches, the control terminal may be a base terminal. Current may flow between the two load terminals of each semiconductor device of semiconductor devices 144, 154, based on the voltage at the respective control terminal. Therefore, electrical current may flow across semiconductor devices 144, 154 based on control signals delivered to the respective control terminals of semiconductor devices 144, 154. In one example, if a voltage applied to the control terminal of a semiconductor device of semiconductor devices 144, 154 is greater than or equal to a voltage threshold, the respective semiconductor device may be activated, allowing the semiconductor device to conduct electricity across the load terminals of the semiconductor device. Furthermore, the semiconductor device be deactivated when the voltage applied to the respective control terminal of the semiconductor device is below the threshold voltage, thus preventing the semiconductor device from conducting electricity. A controller (not illustrated in FIG. 1) may be configured to independently control semiconductor devices 144, 154 such that one, a combination, all, or none of semiconductor devices 144, 154 may be activated at a point in time. For example, the controller may be configured to control high-side gate driver circuits 142 and low-side gate driver circuits 152 (collectively, "gate driver circuits 142, 152") in order to activate or deactivate semiconductor devices 144, 154, respectively.

Semiconductor devices 144, 154 may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow semiconductor devices 144, 154 to draw short bursts of current from power source 110. These higher frequency semiconductor devices may require control signals (e.g., voltage signals delivered by gate driver circuits 142, 152) to respective control terminals of semiconductor devices 144, 154) to be sent with more precise timing, as compared to lower-frequency semiconductor devices.

Each high-side gate driver circuit 142 may, in some cases, be electrically connected to a gate terminal of a respective high-side semiconductor devices 144 such that the gate driver circuit may deliver a control signal in order to control an operation of the high-side semiconductor device. In this way, a number of high-side gate driver circuits 142 may be equal to a number of high-side semiconductor devices 144. Each high-side gate driver circuit of high-side gate driver circuits 142 may receive at least a portion of the first electrical signal generated by power converter unit 120 and receive at least a portion of the second electrical signal generated by charge pump unit 130. In some examples, a high-side gate driver circuit of high-side gate driver circuits 142 may alternate between supplying the first electrical signal and supplying the second electrical signal to the gate terminal of the respective high-side semiconductor device of high-side semiconductor devices 144.

In some examples, the high-side gate driver circuit may determine whether to supply the first electrical signal or supply the second electrical signal based on one or more parameters of a source terminal electrical signal passing through the respective high-side semiconductor device. For example, the high-side gate driver circuit may supply the first electrical signal to the gate of the respective high-side semiconductor device if a source terminal voltage of the source terminal electrical signal is less than the first voltage of the first electrical signal. If the source terminal voltage is not less than the first voltage of the first electrical signal, the high-side gate driver circuit may transition to supplying the second electrical signal to the gate of the respective high-side semiconductor device.

In some examples, a high-side gate driver circuit of high-side gate driver circuits 142 may alternate between supplying the first electrical signal and supplying the second electrical signal to the gate terminal of the respective high-side semiconductor device of high-side semiconductor devices 144 in order to maintain a more reliable and consistent control of the gate terminal as compared with a gate driver circuit which does not alternate between two or more electrical signals for supply to the gate terminal. For example, some gate driver circuits which control high-side semiconductor devices may use a bootstrap capacitor to supplement a control signal supplied to a gate terminal of a semiconductor device. Such gate driver circuits may need to charge the bootstrap capacitors, this limiting an amount of time that the gate driver circuits may maintain the respective semiconductors in an activated state. The high-side gate driver circuits 142 of FIG. 1 may eliminate a need to use and spend time charging bootstrap capacitors, thus increasing an amount of time in which high-side gate driver circuits 142 may maintain high-side semiconductor devices 144 in an activated state as compared with high-side gate driver circuits which include bootstrap capacitors.

Each low-side gate driver circuit 152 may, in some cases, be electrically connected to a gate terminal of a respective low-side semiconductor device 154 such that the low-side gate driver circuit may deliver a control signal in order to control an operation of the low-side semiconductor device. In this way, a number of low-side gate driver circuits 152 may be equal to a number of low-side semiconductor devices 154. Each high-side gate driver circuit of low-side gate driver circuits 152 may receive at least a portion of the first electrical signal generated by power converter unit 120. In some examples, low-side gate driver circuits 152 may deliver the first electrical signal to respective gate terminals of low-side semiconductor devices 154 in order to control whether low-side semiconductor devices 154 are in an activated state or in a deactivated state.

In some examples, circuit 112 may deliver power from power source 110 to load 160. Load 160, in some cases, may represent an electric motor such as a BLDC electric motor, a brushed direct current (DC) motor, an alternating current (AC) induction motor, or another type of electric motor. In the case where load 160 represents a BLDC motor, the BLDC motor may operate according to any one of a set of phases, where each phase of the set of phases is associated with a respective input to load 160. In some examples, each input to load 160 may be supplied by a respective pair of a high-side gate driver circuit of high-side gate driver circuits 142 and a low-side gate driver circuit of low-side gate driver circuits 152. Based on which one or more pairs of semiconductor devices are in an activated state, Load 160 may operate in one or more respective phases of the set of phases.

Figure 2:
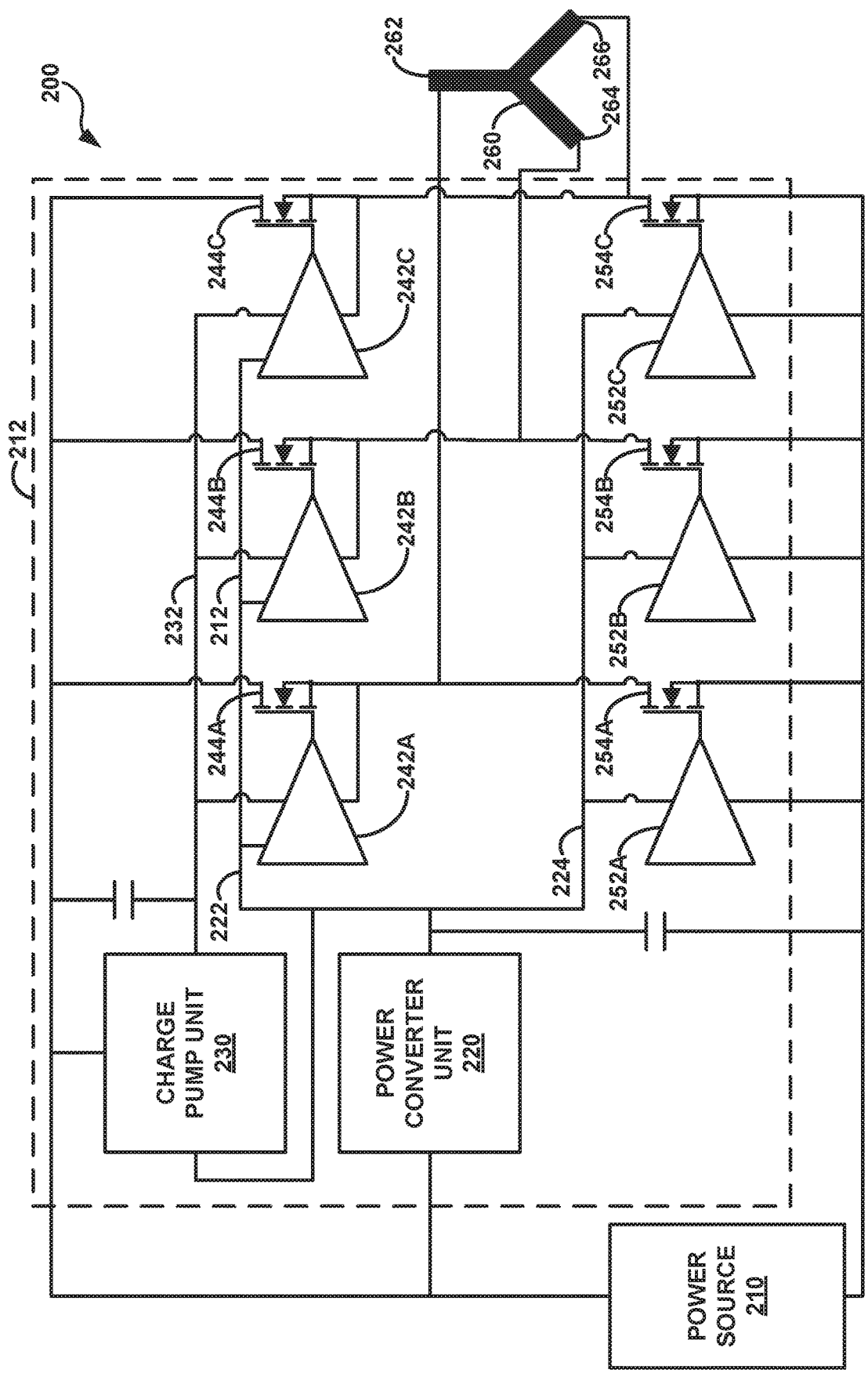
FIG. 2 is a circuit diagram illustrating a system including a first example circuit for delivering power from a power source to a load, in accordance with one or more techniques of this disclosure.

FIG. 2 is a circuit diagram illustrating a system 200 including a first example circuit 212 for delivering power from a power source 210 to a load 260, in accordance with one or more techniques of this disclosure. As seen in FIG. 2, circuit 212 includes power converter unit 220, charge pump unit 230, high-side gate driver circuits 242A-242C (collectively, "high-side gate driver circuits 242"), high-side semiconductor devices 244A-244C (collectively, "high-side semiconductor devices 244"), low-side gate driver circuits 252A-252C (collectively, "low-side gate driver circuits 252"), and low-side semiconductor devices 254A-254C (collectively, "low-side semiconductor devices 254"). Power source 210 may be an example of power source 110 of FIG. 1. Power converter unit 220 may be an example of power converter unit 120 of FIG. 1. Charge pump unit 230 may be an example of charge pump unit 130 of FIG. 1. High-side gate driver circuits 242 may be an example of high-side gate driver circuits 142 of FIG. 1. High-side semiconductor devices 244 may be an example of high-side semiconductor devices 144 of FIG. 1. Low-side gate driver circuits 252 may be an example of low-side gate driver circuits 152 of FIG. 1. Low-side semiconductor devices 254 may be an example of low-side semiconductor devices 154 of FIG. 1.

Circuit 212 may be configured to deliver power from power source 210 to load 260 which represents a multi-stage electrical motor. For example, load 260 may represent a BLDC motor including three stages. Load 260 may include a first input 262, a second input 264, and a third input 266 (collectively, "inputs 262, 264, 266"). Circuit 212 may deliver electrical signals to any one or combination of inputs 262, 264, 266 in order to cause load 260 to operate according to one of three phases. As seen in FIG. 2, high-side semiconductor device 244A and low-side semiconductor device 254A control power delivery to first input 262, high-side semiconductor device 244B and low-side semiconductor device 254B control power delivery to second input 264, and high-side semiconductor device 244C and low-side semiconductor device 254C control power delivery to third input 266.

A gate terminal of each semiconductor device of high-side semiconductor devices 244 may be electrically connected to a respective gate driver circuit of high-side gate driver circuits 242. For example, high-side gate driver circuit 242A is electrically connected to the gate terminal of high-side semiconductor device 244A, high-side gate driver circuit 242B is electrically connected to the gate terminal of high-side semiconductor device 244B, and high-side gate driver circuit 242C is electrically connected to the gate terminal of high-side semiconductor device 244C. Each high-side gate driver circuit of high-side gate driver circuits 242 may receive a first electrical signal from power converter unit 220 via conductor 222, and each high-side gate driver circuit of high-side gate driver circuits 242 may receive a second electrical signal from charge pump unit 230 via conductor 232. Additionally, in some cases, each high-side gate driver circuit of high-side gate driver circuits 242 may alternate between delivering the first electrical signal and delivering the second electrical signal to the respective high-side semiconductor device of high-side semiconductor devices 244 in order to control whether the semiconductor device is in an activated state or in a deactivated state.

A gate terminal of each semiconductor device of low-side semiconductor devices 254 may be electrically connected to a respective gate driver circuit of low-side gate driver circuits 252. For example, low-side gate driver circuit 252A is electrically connected to the gate terminal of low-side semiconductor device 254A, low-side gate driver circuit 252B is electrically connected to the gate terminal of low-side semiconductor device 254B, and low-side gate driver circuit 252C is electrically connected to the gate terminal of low-side semiconductor device 254C. Each low-side gate driver circuit of low-side gate driver circuits 252 may receive the first electrical signal from power converter unit 220 via conductor 224.

Figure 3:
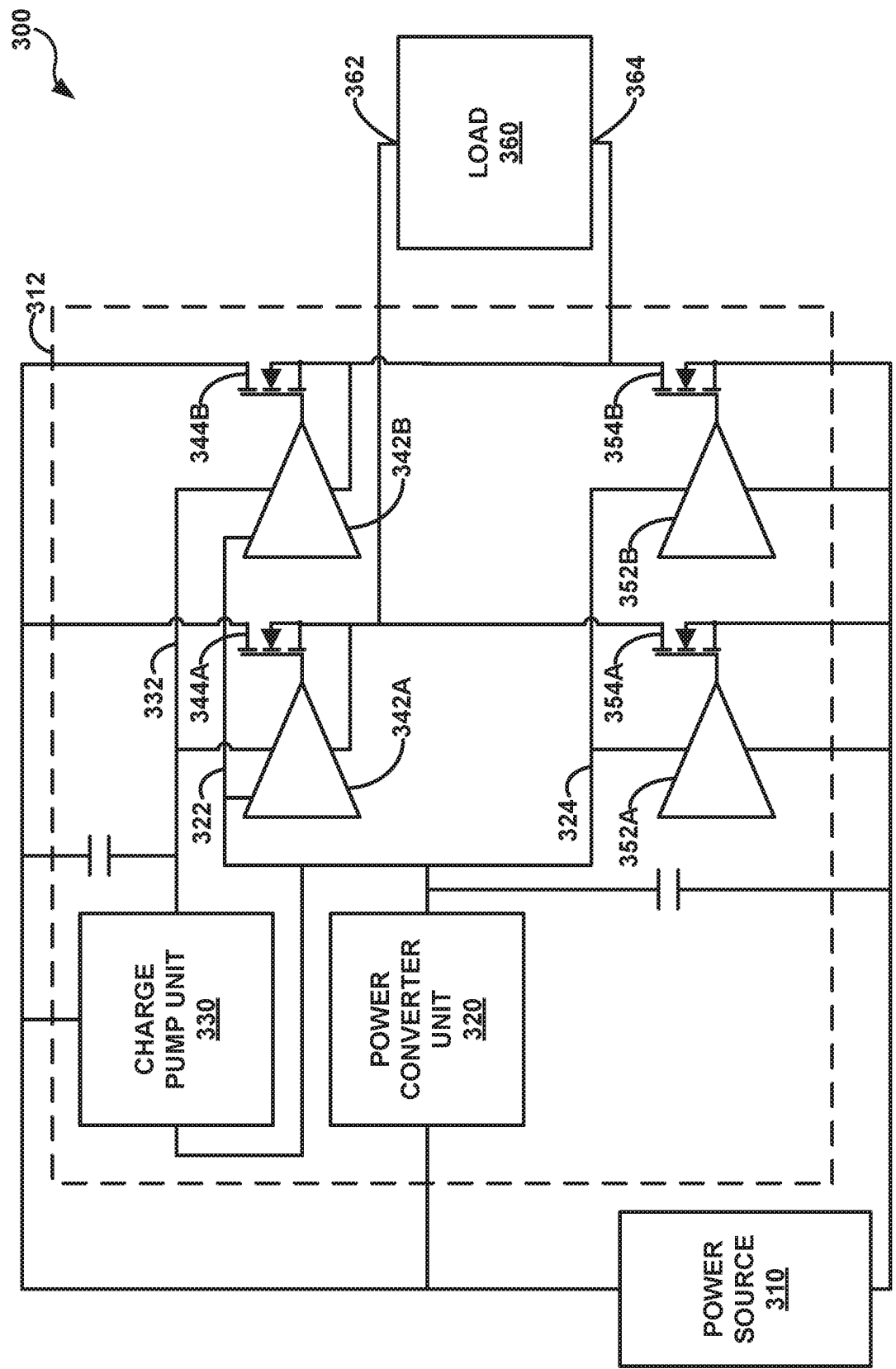
FIG. 3 is a circuit diagram illustrating a system including a second example circuit for delivering power from a power source to a load, in accordance with one or more techniques of this disclosure.

FIG. 3 is a circuit diagram illustrating a system 300 including a second example circuit 312 for delivering power from a power source 310 to a load 360, in accordance with one or more techniques of this disclosure. As seen in FIG. 3, circuit 312 includes power converter unit 320, charge pump unit 330, high-side gate driver circuits 342A-242B (collectively, "high-side gate driver circuits 342"), high-side semiconductor devices 344A-344B (collectively, "high-side semiconductor devices 344"), low-side gate driver circuits 352A-352B (collectively, "low-side gate driver circuits 352"), and low-side semiconductor devices 354A-354B (collectively, "low-side semiconductor devices 354"). Power source 310 may be an example of power source 110 of FIG. 1. Power converter unit 320 may be an example of power converter unit 120 of FIG. 1. Charge pump unit 330 may be an example of charge pump unit 130 of FIG. 1. High-side gate driver circuits 342 may be an example of high-side gate driver circuits 142 of FIG. 1. High-side semiconductor devices 344 may be an example of high-side semiconductor devices 144 of FIG. 1. Low-side gate driver circuits 352 may be an example of low-side gate driver circuits 152 of FIG. 1. Low-side semiconductor devices 354 may be an example of low-side semiconductor devices 154 of FIG. 1.

Circuit 312 may be configured to deliver power from power source 310 to load 360 which represents a multi-stage electrical motor. Load 360 may include a first input 362 and a second input 364 (collectively, "inputs 362, 364"). Circuit 312 may deliver electrical signals to any one or both of inputs 362, 364. As seen in FIG. 3, high-side semiconductor device 344A and low-side semiconductor device 354A control power delivery to first input 362 and high-side semiconductor device 344B and low-side semiconductor device 354B control power delivery to second input 364.

A gate terminal of each semiconductor device of high-side semiconductor devices 344 may be electrically connected to a respective gate driver circuit of high-side gate driver circuits 342. For example, high-side gate driver circuit 342A is electrically connected to the gate terminal of high-side semiconductor device 344A and high-side gate driver circuit 342B is electrically connected to the gate terminal of high-side semiconductor device 344B. Each high-side gate driver circuit of high-side gate driver circuits 342 may receive a first electrical signal from power converter unit 320 via conductor 322, and each high-side gate driver circuit of high-side gate driver circuits 342 may receive a second electrical signal from charge pump unit 330 via conductor 332. Additionally, in some cases, each high-side gate driver circuit of high-side gate driver circuits 342 may alternate between delivering the first electrical signal and delivering the second electrical signal to the respective high-side semiconductor device of high-side semiconductor devices 344 in order to control whether the semiconductor device is in an activated state or in a deactivated state.

A gate terminal of each semiconductor device of low-side semiconductor devices 354 may be electrically connected to a respective gate driver circuit of low-side gate driver circuits 352. For example, low-side gate driver circuit 352A is electrically connected to the gate terminal of low-side semiconductor device 354A and low-side gate driver circuit 352B is electrically connected to the gate terminal of low-side semiconductor device 354B. Each low-side gate driver circuit of low-side gate driver circuits 352 may receive the first electrical signal from power converter unit 320 via conductor 324.

Figure 4:
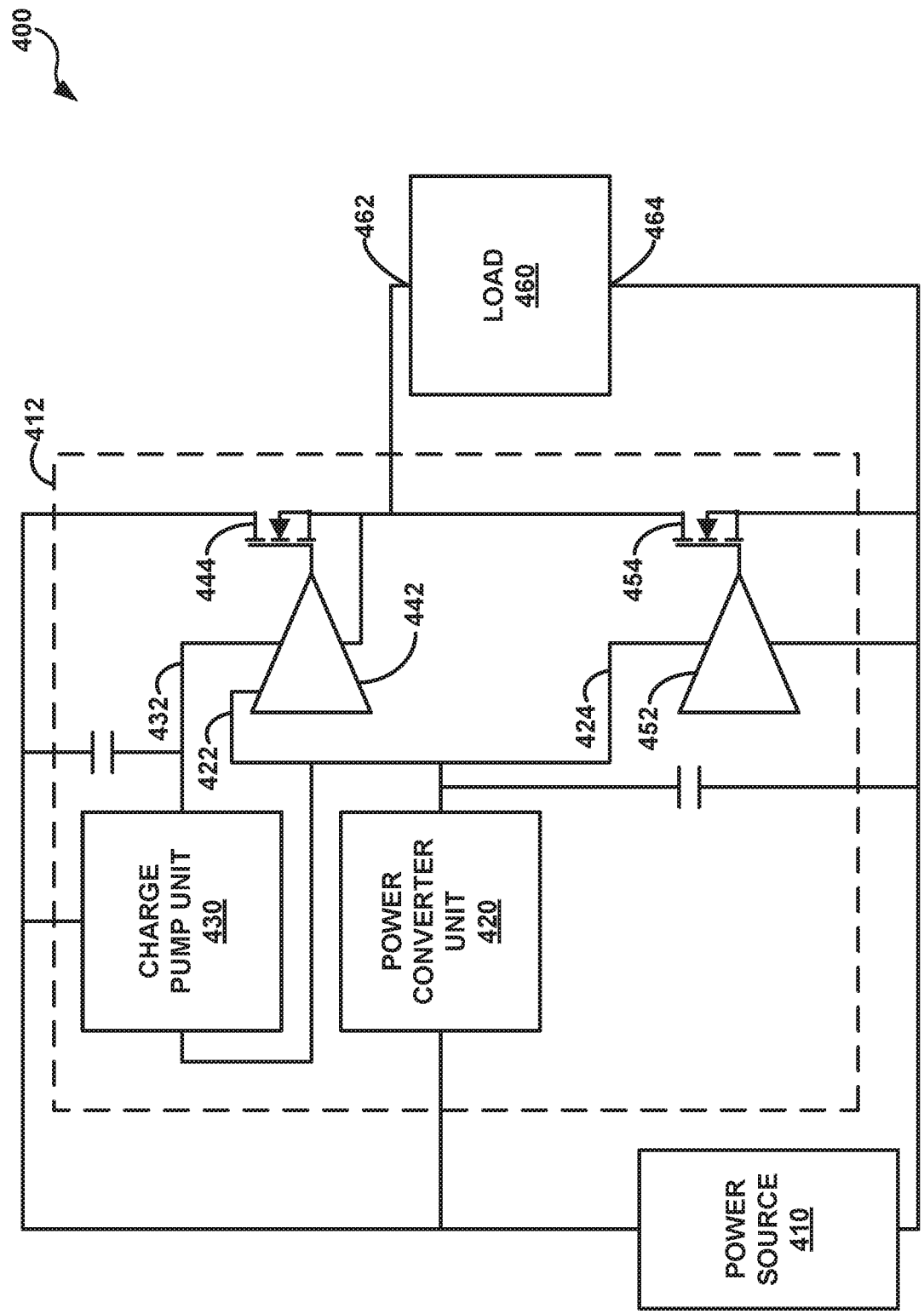
FIG. 4 is a circuit diagram illustrating a system including a third example circuit for delivering power from a power source to a load, in accordance with one or more techniques of this disclosure.

FIG. 4 is a circuit diagram illustrating a system 400 including a third example circuit 412 for delivering power from a power source 410 to a load 460, in accordance with one or more techniques of this disclosure. As seen in FIG. 4, circuit 412 includes power converter unit 420, charge pump unit 430, high-side gate driver circuit 442, high-side semiconductor device, low-side gate driver circuit 452, and low-side semiconductor device 454. Power source 410 may be an example of power source 110 of FIG. 1. Power converter unit 420 may be an example of power converter unit 120 of FIG. 1. Charge pump unit 430 may be an example of charge pump unit 130 of FIG. 1. High-side gate driver circuit 442 may be an example of high-side gate driver circuits 142 of FIG. 1. High-side semiconductor device 444 may be an example of high-side semiconductor devices 144 of FIG. 1. Low-side gate driver circuit 452 may be an example of low-side gate driver circuits 152 of FIG. 1. Low-side semiconductor device 454 may be an example of low-side semiconductor devices 154 of FIG. 1.

Circuit 412 may be configured to deliver power from power source 410 to load 460 which represents, in some cases, an electrical motor. Load 460 may include an input 462 and an output 464. Circuit 412 may deliver an electrical signal to input 462. As seen in FIG. 4, high-side semiconductor device 444 and low-side semiconductor device 454 control power delivery to input 462. A gate terminal of high-side semiconductor device 444 may be electrically connected to a high-side gate driver circuit 442. High-side gate driver circuit 442 may receive a first electrical signal from power converter unit 420 via conductor 422, high-side gate driver circuit 442 may receive a second electrical signal from charge pump unit 430 via conductor 432. Additionally, in some cases, the high-side gate driver circuit 442 may alternate between delivering the first electrical signal and delivering the second electrical signal to high-side semiconductor device 444 in order to control whether semiconductor device 444 is in an activated state or in a deactivated state. A gate terminal of low-side semiconductor device 454 may be electrically connected to a low-side gate driver circuit 452. The low-side gate driver circuit 452 may receive the first electrical signal from power converter unit 420 via conductor 424.

Figure 5A:
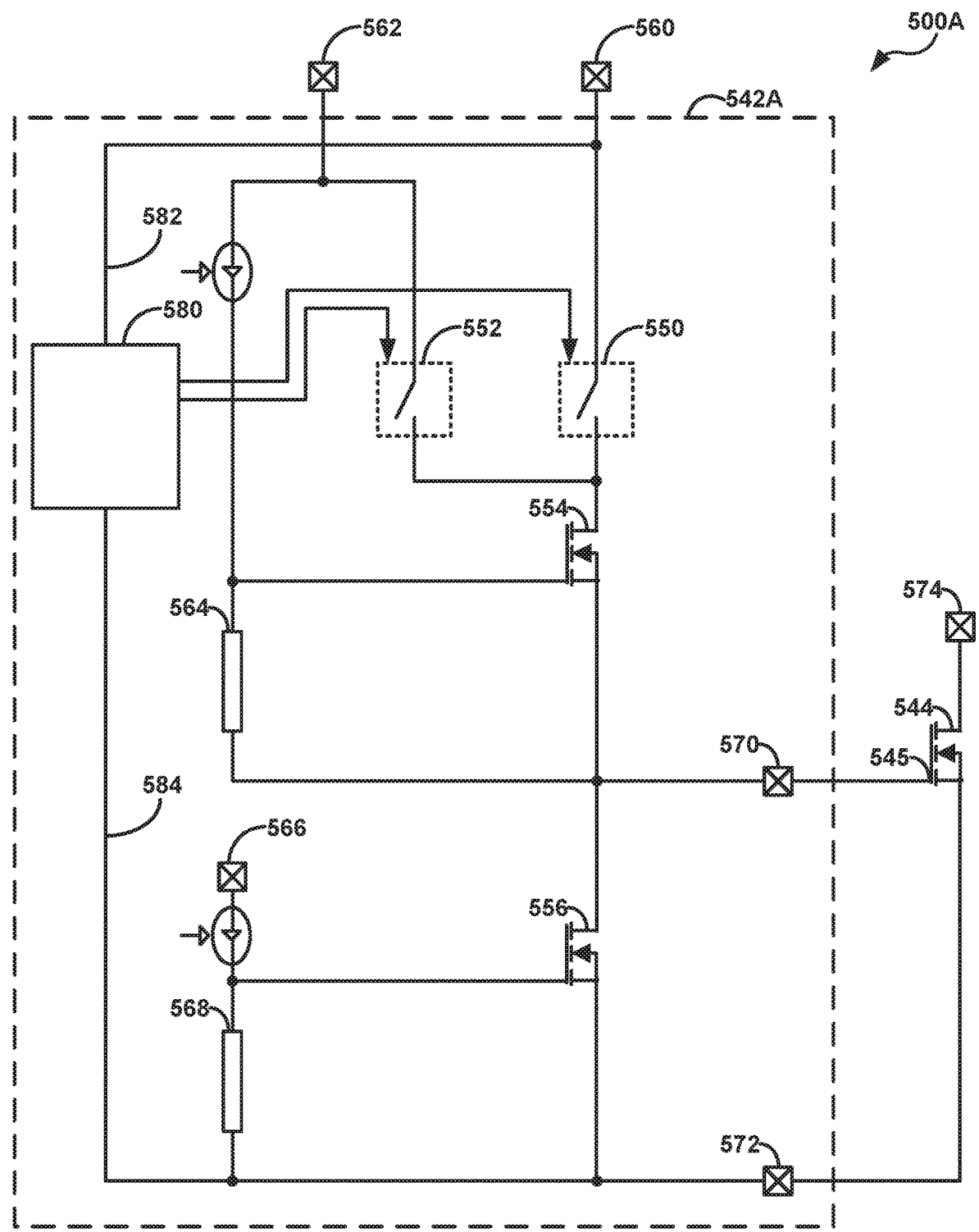
FIG. 5A is a circuit diagram illustrating a system which includes a first example high-side gate driver circuit, in accordance with one or more techniques of this disclosure.

FIG. 5A is a circuit diagram illustrating a system 500A which includes a first example high-side gate driver circuit 542A, in accordance with one or more techniques of this disclosure. As seen in FIG. 5A, system 500A includes high-side gate driver circuit 542A and high-side semiconductor device 544, second switching device 552. High-side gate driver circuit 542A includes first switching device 550, second switching device 552, first gate driver semiconductor device 554, second gate driver semiconductor device 556, first resistor 564, second resistor 568, and comparator device 580. Additionally, high-side gate driver circuit 542A includes pin 560, pin 562, pin 566, pin 570, and pin 572 which represent input/output electrical connections.

High-side semiconductor device 544 may be an example of any of high-side semiconductor devices 144 of FIG. 1, any of high-side semiconductor devices 244 of FIG. 2, any of high-side semiconductor devices 344 of FIG. 3, or high-side semiconductor device 444. High-side gate driver circuit 542A may be an example of a gate driver circuit electrically connected to high-side semiconductor device 544. For example, high-side gate driver circuit 542A may be an example of any of high-side gate driver circuits 142 of FIG. 1, any of high-side gate driver circuits 242 of FIG. 2, any of high-side gate driver circuits 342 of FIG. 3, or high-side gate driver circuit 442 of FIG. 4.

As seen in the example of FIG. 5A, gate terminal 545 of high-side semiconductor device 544 is electrically connected to high-side gate driver circuit 542A. High-side gate driver circuit 542A may deliver a control signal to gate terminal 545 to control whether high-side semiconductor device 544 is operating in an activated state or operating in a deactivated state. When high-side semiconductor device 544 is operating in an activated state, an electrical current may flow across high-side semiconductor device 544 from pin 574 to pin 572, for example. When high-side semiconductor device 544 is operating in a deactivated state, high-side semiconductor device 544 may prevent electrical current from flowing across high-side semiconductor device 544. In some examples, electrical current which flows across high-side semiconductor device 544 is delivered to pin 574 from a power source (e.g., power source 110 of FIG. 1).

In some examples, high-side gate driver circuit 542A may receive a first electrical signal via pin 560 and receive a second electrical signal via pin 562. High-side gate driver circuit 542A may receive the first electrical signal from a power converter unit, such as power converter unit 120 of FIG. 1. High-side gate driver circuit 542A may receive the second electrical signal from a charge pump unit, such as charge pump unit 130 of FIG. 1. In some examples, the first electrical signal may include a first voltage and a first current and the second electrical signal may include a second voltage and a second current. In some cases, a magnitude of the second voltage may be different than a magnitude of the first voltage. In some examples, the magnitude of the second voltage may be greater than the magnitude of the first voltage. In some examples, high-side gate driver circuit 542A may deliver either the first electrical signal or the second electrical signal to the gate terminal 545 of high-side semiconductor device 544 in order to control whether high-side semiconductor device 544 operates in the activated state or operates in the deactivated state.

High-side gate driver circuit 542A may alternate between delivering the first electrical signal to gate terminal 545 and delivering the second electrical signal to gate terminal 545 by controlling first switching device 550 and second switching device 552, respectively. For example, if first switching device 550 is closed (e.g., able to conduct electricity) and second switching device 552 is open (e.g., not able to conduct electricity), high-side gate driver circuit 542A may deliver the first electrical signal to gate terminal 545. Alternatively, if first switching device 550 is open and second switching device 552 is closed, high-side gate driver circuit 542A may deliver the second electrical signal to gate terminal 545. In some examples, comparator device 580 may control whether first switching device 550 is open or closed and comparator device 580 may control whether second switching device 552 is open or closed. For example, comparator device 580 may output a first control signal to first switching device 550 and output a second control signal to second switching device 552.

In some examples, comparator device 580 controls first switching device 550 and second switching device 552 based on a comparison between the first electrical signal received by high-side gate driver circuit 542A via first pin 560 and a source electrical signal passing through high-side semiconductor device 544 and pin 572. For example, comparator device 580 receives the source electrical signal including a source voltage and a source current via conductor 584 and comparator device 580 receives the first electrical signal including the first voltage and the first current via conductor 582.

Comparator device 580 compares a magnitude of the first voltage with a magnitude of the source voltage in real time or near real time in order to determine whether to maintain each of first switching device 550 and second switching device 552 in an open state or a closed state For example, in response to determining that the magnitude of the source voltage (e.g., the magnitude of the voltage at pin 572) is lower than the magnitude of the first voltage (e.g., the magnitude of the voltage at pin 560), comparator device 580 may maintain first switching device 550 in a closed state and maintain second switching device 552 in an open state, causing pin 560 to supply the first voltage to pin 570 and a gate of semiconductor device 544. In response to determining that the magnitude of the source voltage (e.g., the magnitude of the voltage at pin 572) is greater than or equal to than the magnitude of the first voltage (e.g., the magnitude of the voltage at pin 560), comparator device 580 may maintain first switching device 550 in an open state and maintain second switching device 552 in a closed state, causing pin 562 to supply a second voltage to pin 570 and the gate of semiconductor device 544.

If comparator device 580 detects that the magnitude of the source voltage transitions from being lower than the magnitude of the first voltage to being equal to or greater than the magnitude of the first voltage, comparator device 580 may transition second switching device from an open state to a closed state. In such an example, first switching device 550 might be unable to conduct electricity regardless of whether first switching device 550 is in an open state or in a closed state. In some examples, comparator device 580 may transition first switching device from a closed state to an open state in response to comparator device 580 detecting that the magnitude of the source voltage transitions from being lower than the magnitude of the first voltage to being equal to or greater than the magnitude of the first voltage. When first switching device 550 is open and second switching device 552 is closed, high-side gate driver circuit 542A may deliver the second electrical signal to gate terminal 545 from pin 562. In some examples, a magnitude of the second voltage of the second electrical signal is greater than the magnitude of the first voltage of the first electrical signal such that high-side gate driver circuit 542A may continue to apply a voltage to gate terminal 545 while the magnitude of the source voltage is greater than or equal to the magnitude of the first voltage.

In some examples, in response to comparator device 580 detecting that the magnitude of the source voltage transitions from being lower than the magnitude of the first voltage to being equal to or greater than the magnitude of the first voltage, comparator device 580 may determine that a Miller plateau is occurring. A Miller plateau may represent a period of time in which the gate-source voltage of high-side semiconductor device 544 remains constant or increases by a small amount over a period of time. In some examples, comparator 580 is configured to activate the second switching device 552 in response to determining that the Miller plateau has occurred and deactivate the first switching device 550 in response to determining that the Miller plateau has occurred.

If comparator device 580 detects that the magnitude of the source voltage transitions from being greater than or equal to the magnitude of the first voltage to being less than the magnitude of the first voltage, comparator device 580 may transition second switching device 552 from a closed state to an open state. Additionally, comparator device 580 may transition first switching device 550 from an open state to a closed state. In such an example, second switching device 552 may be unable to conduct electricity and first switching device 550 may conduct electricity. When first switching device 550 is closed and second switching device 552 is open, high-side gate driver circuit 542A may deliver the first electrical signal to gate terminal 545 from pin 560.

In some examples, first gate driver semiconductor device 554 and second gate driver semiconductor device 556 (collectively, "semiconductor devices 554, 556") may, in some cases, include power switches such as, but not limited to, any type of FET including any one or combination of MOSFETs, BJTs, IGBTs, JFETs, HEMTs, or other elements that use voltage for control. Additionally, semiconductor devices 554, 556 may include n-type transistors, p-type transistors, and power transistors, or any combination thereof. In some examples, semiconductor devices 554, 556 include vertical transistors, lateral transistors, and/or horizontal transistors. In some examples, semiconductor devices 554, 556 include other analog devices such as diodes and/or thyristors. In some examples, semiconductor devices 554, 556 may operate as switches and/or as analog devices.

In some examples, a gate terminal of first gate driver semiconductor device 554 receives a control signal which represents the second electrical signal from pin 562. In some examples, a gate terminal of second gate driver semiconductor device 556 receives a control signal from pin 566. The gate terminal of first gate driver semiconductor device 554 may be electrically connected to first resistor 564. The second gate driver semiconductor device 556 may be electrically connected to second resistor 568. In some cases, first gate driver semiconductor device 554 may conduct the first electrical signal if the first switching device 550 is closed and the second switching device 552 is open. In some cases, second gate driver semiconductor device 556 may conduct the second electrical signal if the second switching device 552 is closed and the first switching device 550 is unable to conduct the first electrical signal (e.g., if the magnitude of the source voltage at pin 572 is greater than or equal to the magnitude of the first voltage of the first electrical signal. In some examples, high-side gate driver circuit 542A and high-side semiconductor device 544 form an integrated circuit. In some examples, high-side semiconductor device 544 is a discrete semiconductor device electrically connected to high-side gate driver circuit 542A.

Figure 5B:
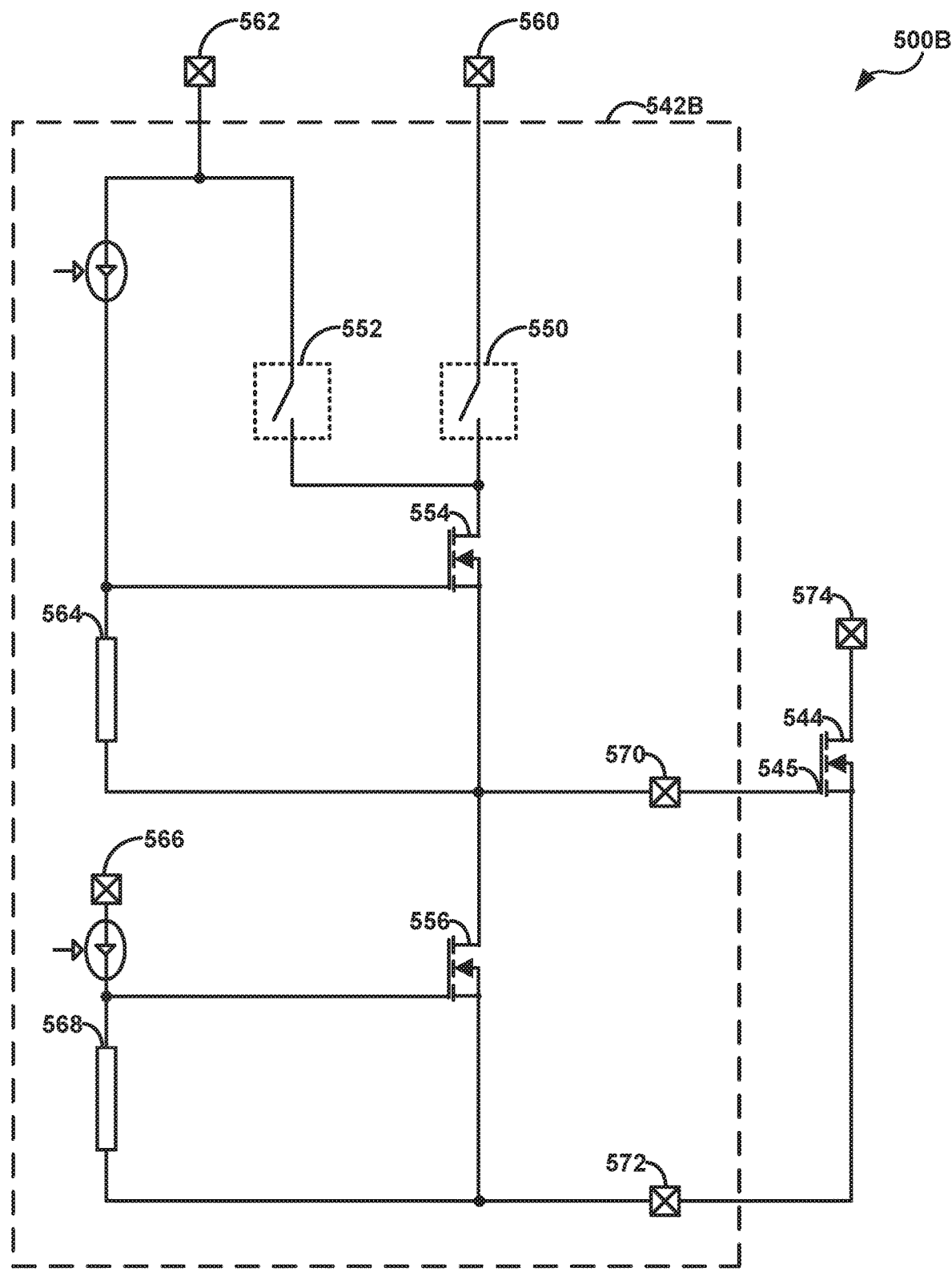
FIG. 5B is a circuit diagram illustrating a system which includes a second example high-side gate driver circuit, in accordance with one or more techniques of this disclosure.

FIG. 5B is a circuit diagram illustrating a system 500B which includes a second example high-side gate driver circuit 542B, in accordance with one or more techniques of this disclosure. As seen in FIG. 5B, system 500B includes high-side gate driver circuit 542B and high-side semiconductor device 544, second switching device 552. High-side gate driver circuit 542B includes first switching device 550, second switching device 552, first gate driver semiconductor device 554, second gate driver semiconductor device 556, first resistor 564, and second resistor 568. Additionally, high-side gate driver circuit 542B includes pin 560, pin 562, pin 566, pin 570, and pin 572 which represent input/output electrical connections.

High-side semiconductor device 544 may be an example of any of high-side semiconductor devices 144 of FIG. 1, any of high-side semiconductor devices 244 of FIG. 2, any of high-side semiconductor devices 344 of FIG. 3, or high-side semiconductor device 444. High-side gate driver circuit 542B may be an example of a gate driver circuit electrically connected to high-side semiconductor device 544. For example, high-side gate driver circuit 542B may be an example of any of high-side gate driver circuits 142 of FIG. 1, any of high-side gate driver circuits 242 of FIG. 2, any of high-side gate driver circuits 342 of FIG. 3, or high-side gate driver circuit 442 of FIG. 4. In some examples, high-side gate driver circuit 542B may be substantially the same as high-side gate driver circuit 542A of FIG. 5A except that gate driver circuit 542B does not include comparator device 580. High-side gate driver circuit 542B may cause each of first switching device 550 and second switching device 552 to open and/or close similar to how high-side gate driver circuit 542A controls first switching device 550 and second switching device 552, except high-side gate driver circuit 542B uses other techniques of comparing the magnitude of the source voltage at pin 572 and the magnitude of the first voltage at pin 560.

Figure 6:
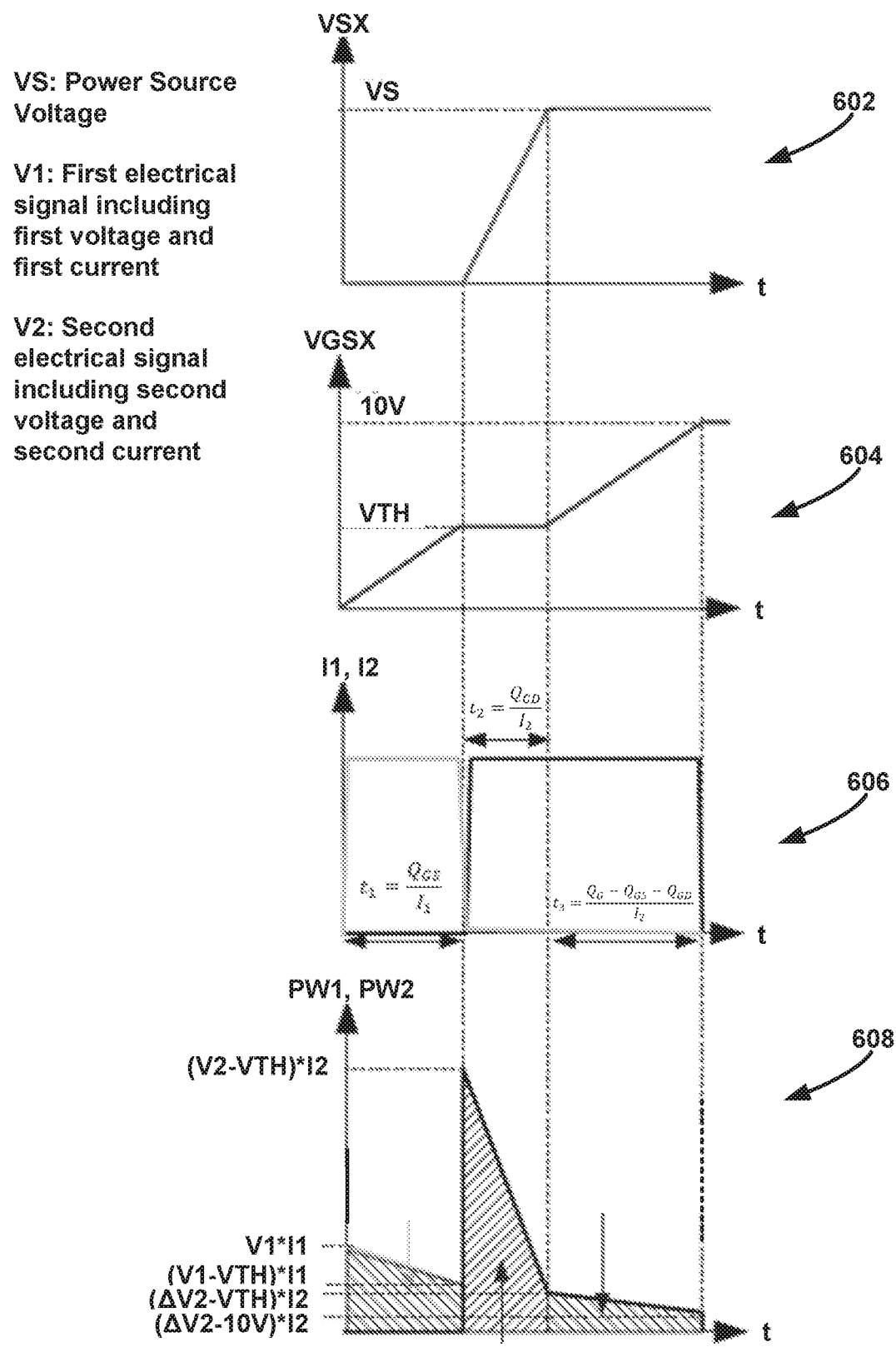
FIG. 6 is a conceptual diagram illustrating a series of graphs corresponding to a high-side gate driver circuit and a respective high-side semiconductor device, in accordance with one or more techniques of this disclosure.

FIG. 6 is a conceptual diagram illustrating a series of graphs corresponding to a high-side gate driver circuit and a respective high-side semiconductor device, in accordance with one or more techniques of this disclosure. For example, graph 602 represents a graph of a voltage across a high-side semiconductor device (e.g., high-side semiconductor device 544) over a period of time. Graph 604 represents a voltage of a gate-source signal over a period of time representing the same period of time of graph 602. The plateau shown in graph 604, where the gate-source voltage does not significantly increase from "VTH" for a window of time, may be referred to herein as a "Miller Plateau." Graph 606 represents a magnitude of a current delivered to the gate terminal 545 of high-side semiconductor device 544. As seen in graph 606, at the end of the time period $t_1$, high-side semiconductor device 544 switches from supplying the first current I1 to gate terminal 545 to supplying the second current I2 to gate terminal 545. Graph 608 represents a power delivered to the gate terminal 545 over the same period of time of graph 602, graph 604, and graph 606. In some examples, 'VS' represents a power source voltage (e.g., the voltage at pin 574 of FIG. 5), 'V1' represents the first voltage of the first electrical signal (e.g., the voltage at pin 560 of FIG. 5), and 'V2' represents the second voltage of the second electrical signal (e.g., the voltage at pin 562 of FIG. 5).

Figure 7:
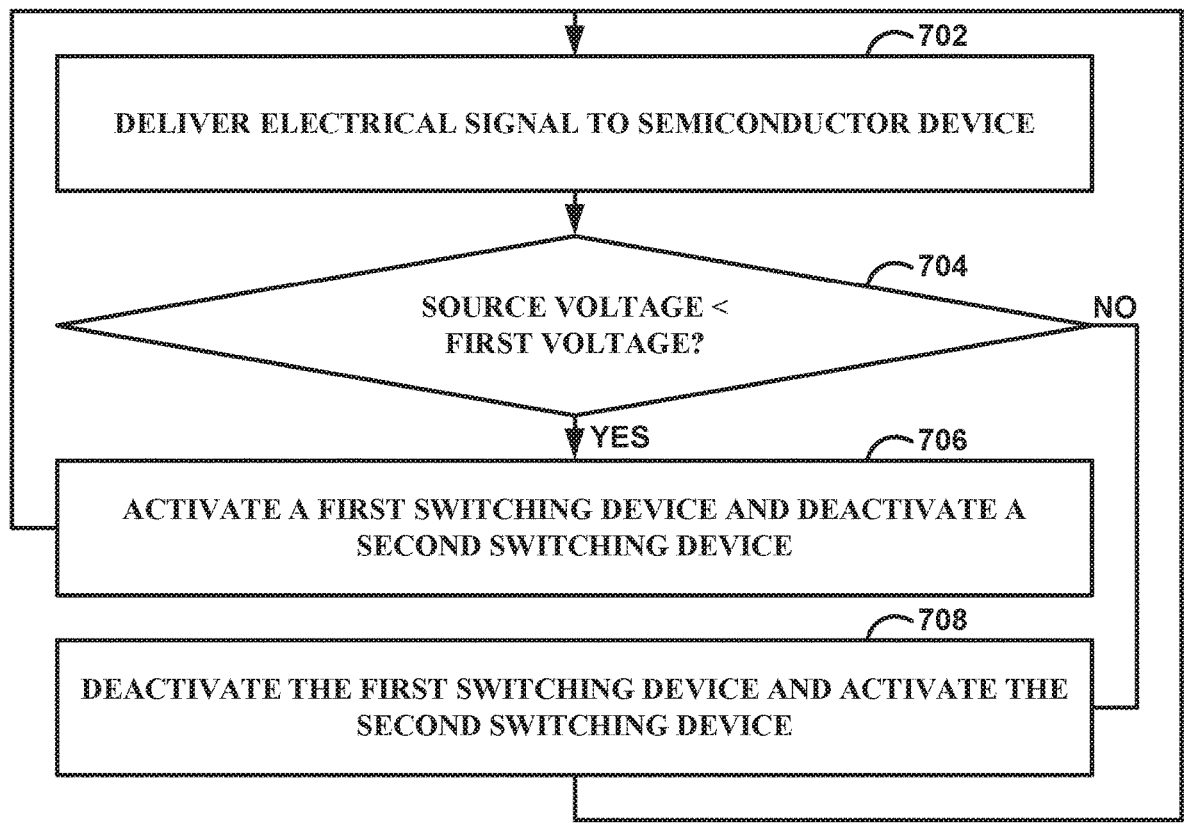
FIG. 7 is a flow diagram illustrating an example operation for controlling a semiconductor device, in accordance with one or more techniques of this disclosure.

FIG. 7 is a flow diagram illustrating an example operation for controlling a semiconductor device, in accordance with one or more techniques of this disclosure. For convenience, FIG. 7 is described with respect to system 500A of FIG. 5A. However, the techniques of FIG. 7 may be performed by different components of system 500A or by additional or alternative systems.

High-side gate driver circuit 542A is configured to deliver an electrical signal to gate terminal 545 of high-side semiconductor device 544 (702). In some examples, the electrical signal may represent a first electrical signal received by high-side gate driver circuit 542A via pin 560. In some examples, the electrical signal may represent a second electrical signal received by high-side gate driver circuit 542A via pin 562. In some examples, comparator device 580 may receive at least a portion of the first electrical signal including a first voltage and comparator device 580 may receive at least a portion of a source signal including a source voltage. Comparator device 580 may determine whether the source voltage is less than the first voltage (704). If the source voltage is less than the first voltage ("YES" branch of block 704), comparator device 580 may activate a first switching device 550 and deactivate a second switching device 552 (706), causing high-side gate driver circuit 542A to deliver the first electrical signal to gate terminal 545 of high-side semiconductor device 544. If the source voltage is not less than the first voltage ("NO" branch of block 704), comparator device 580 may deactivate a first switching device 550 and activate a second switching device 552 (706), causing high-side gate driver circuit 542A to deliver the second electrical signal to gate terminal 545 of high-side semiconductor device 544.

In one or more examples, the techniques described herein may utilize hardware, software, firmware, or any combination thereof for achieving the functions described. Those functions implemented in software may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure.

Instructions may be executed by one or more processors within system 100. The one or more processors may, for example, include one or more digital signal processors (DSPs), general purpose microprocessors, application specific integrated circuits application specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for performing the techniques described herein. Also, the techniques could be fully implemented in one or more circuits or logic elements.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware.

The following numbered examples demonstrate one or more aspects of the disclosure.

Example 1. A circuit for controlling a semiconductor device, the circuit including: a first switching device; and a second switching device, where the circuit is configured to: activate, in response to a source voltage of the semiconductor device being lower than a first voltage, the first switching device in order to cause the circuit to deliver a first electrical signal to the semiconductor device, where the first electrical signal includes the first voltage; deactivate the first switching device in response to the source voltage of the semiconductor device not being lower than the first voltage; activate, in response to the source voltage of the semiconductor device not being lower than the first voltage, the second switching device to cause the circuit to deliver a second electrical signal to the semiconductor device, where the second electrical signal includes a second voltage which is different from the first voltage; and deactivate the second switching device in response to the source voltage of the semiconductor device being lower than the first voltage.

Example 2. The circuit of example 1, where the circuit further includes a comparator device configured to: receive the first electrical signal including the first voltage; receive, from the semiconductor device, a source signal including the source voltage; and compare a magnitude of the first voltage with a magnitude of the source voltage in order to control the first switching device and the second switching device.

Example 3. The circuit of examples 1-2 or any combination thereof, where to activate the second switching device, the circuit is configured to output, from the comparator device, a signal causing the second switching device to activate based on the magnitude of the source voltage not being lower than the magnitude of the first voltage.

Example 4. The circuit of examples 1-3 or any combination thereof, where to activate the first switching device, the circuit is configured to output, from the comparator device, a signal causing the first switching device to activate based on the magnitude of the source voltage being lower than the magnitude of the first voltage.

Example 5. The circuit of examples 1-4 or any combination thereof, where the circuit is further configured to: determine, in response to a transition of the source voltage from being lower than the first voltage to being equal to the first voltage, that a Miller plateau has occurred; activate the second switching device in response to determining that the Miller plateau has occurred; and deactivate the first switching device in response to determining that the Miller plateau has occurred.

Example 6. The circuit of examples 1-5 or any combination thereof, where the circuit further includes a power converter device configured to: receive, from a power source, a power source signal including a power source voltage; and generate, using the power source signal, the first electrical signal including the first voltage and a first current.

Example 7. The circuit of examples 1-6 or any combination thereof, where to generate the first electrical signal, the power converter device is configured to: boost the power source voltage in response to the power source voltage being lower than a threshold power source voltage; and buck the power source voltage in response to the power source voltage not being lower than the threshold power source voltage.

Example 8. The circuit of examples 1-7 or any combination thereof, where the power converter device is further configured to: regulate the first voltage of the first electrical signal to be within a target voltage range including a target voltage value.

Example 9. The circuit of examples 1-8 or any combination thereof, where the target voltage range extends from 15 Volts (V) to 25 V, and where the target voltage value includes 18V.

Example 10. The circuit of examples 1-9 or any combination thereof, where the circuit further includes a charge pump device configured to: receive, from the power source, the power source signal including the power source voltage; receive, from the power converter device, the first electrical signal including the first voltage and the first current; and generate, using the power source signal and the first electrical signal, the second electrical signal including the second voltage and a second current.

Example 11. The circuit of examples 1-10 or any combination thereof, where to generate the second electrical signal, the charge pump device is configured to: boost the first voltage to generate the second electrical signal including the second voltage, where the second voltage is lower than the first voltage.

Example 12. The circuit of examples 1-11 or any combination thereof, where the circuit further includes: a first set of semiconductor devices including the semiconductor device, where each semiconductor device of the first set of semiconductor devices are positioned between the power source and a load; and a second set of semiconductor devices, where the load is positioned between the power source and each semiconductor device of the second set of semiconductor devices, and where the first set of semiconductor devices and the second set of semiconductor devices are configured to: deliver at least a portion of the power source signal to the load.

Example 13. The circuit of examples 1-11 or any combination thereof, where the first set of semiconductor devices includes within a range from one semiconductor device to three semiconductor devices, and where the second set of semiconductor devices includes within a range from one semiconductor device to three semiconductor devices.

Example 14. A method including: activating, by a circuit in response to a source voltage of a semiconductor device being lower than a first voltage, a first switching device in order to cause the circuit to deliver a first electrical signal to the semiconductor device, where the first electrical signal includes the first voltage; deactivating, by the circuit, the first switching device in response to the source voltage of the semiconductor device not being lower than the first voltage; activating, by the circuit in response to the source voltage of the semiconductor device not being lower than the first voltage, a second switching device to cause the circuit to deliver a second electrical signal to the semiconductor device, where the second electrical signal includes a second voltage which is different from the first voltage; and deactivating, by the circuit, the second switching device in response to the source voltage of the semiconductor device being lower than the first voltage.

Example 15. The circuit of example 14, further including: receiving, by a comparator device of the circuit, the first electrical signal including the first voltage; receiving, by the comparator device, a source signal including the source voltage from the semiconductor device; and comparing, by the comparator device, a magnitude of the first voltage with a magnitude of the source voltage in order to control the first switching device and the second switching device.

Example 16. The method of examples 14-15 or any combination thereof, where activating the second switching device includes outputting, from the comparator device, a signal causing the second switching device to activate based on the magnitude of the source voltage not being lower than the magnitude of the first voltage.

Example 17. The method of examples 14-16 or any combination thereof, where activating the first switching device includes outputting, from the comparator device, a signal causing the first switching device to activate based on the magnitude of the source voltage being lower than the magnitude of the first voltage.

Example 18. The method of examples 14-17 or any combination thereof, where the method further includes: determining, in response to a transition of the source voltage from being lower than the first voltage to being equal to the first voltage, that a Miller plateau has occurred; activating the second switching device in response to determining that the Miller plateau has occurred; and deactivating the first switching device in response to determining that the Miller plateau has occurred.

Example 19. The method of examples 14-18 or any combination thereof, where the method further includes: receiving, by a power converter device of the circuit, a power source signal including a power source voltage from a power source; and generating, by the power converter device using the power source signal, the first electrical signal including the first voltage and a first current.

Example 20. The method of examples 14-19 or any combination thereof, where generating the first electrical signal includes: boosting the power source voltage in response to the power source voltage being lower than a threshold power source voltage; and bucking the power source voltage in response to the power source voltage not being lower than the threshold power source voltage.

Example 21. The method of examples 14-20 or any combination thereof, where the method further includes: regulating, using the power converter device, the first voltage of the first electrical signal to be within a target voltage range including a target voltage value.

Example 22. The method of examples 14-21 or any combination thereof, where the method further includes: receiving, by a charge pump device, the power source signal including the power source voltage from the power source; receiving, by the charge pump device, the first electrical signal including the first voltage and the first current from the power converter device; and generating, by the charge pump device using the power source signal and the first electrical signal, the second electrical signal including the second voltage and a second current.

Example 23. The method of examples 14-22 or any combination thereof, where generating the second electrical signal includes: boosting the first voltage to generate the second electrical signal including the second voltage.

Example 24. The method of examples 14-23 or any combination thereof, where the circuit further includes: a first set of semiconductor devices including the semiconductor device, where each semiconductor device of the first set of semiconductor devices are positioned between the power source and a load; and a second set of semiconductor devices, where the load is positioned between the power source and each semiconductor device of the second set of semiconductor devices, and where the method further includes: delivering, using the first set of semiconductor devices and the second set of semiconductor devices, at least a portion of the power source signal to the load.

Example 25. A system including: a semiconductor device including a gate, where the semiconductor device is configured to receive, from a power source, a power source signal including a power source voltage; and a circuit including a first switching device and a second switching device, where the circuit is configured to: activate, in response to a source voltage of the semiconductor device being lower than a first voltage, the first switching device in order to cause the circuit to deliver a first electrical signal to the gate of the semiconductor device, where the first electrical signal includes the first voltage; deactivate the first switching device in response to the source voltage of the semiconductor device not being lower than the first voltage; activate, in response to the source voltage of the semiconductor device not being lower than the first voltage, the second switching device to cause the circuit to deliver a second electrical signal to the gate of the semiconductor device, where the second electrical signal includes a second voltage which is different from the first voltage; and deactivate the second switching device in response to the source voltage of the semiconductor device being lower than the first voltage.

Example 26. The system of example 26, wherein the circuit further comprises a comparator device configured to: receive the first electrical signal comprising the first voltage; receive, from the semiconductor device, a source signal comprising the source voltage; and compare a magnitude of the first voltage with a magnitude of the source voltage in order to control the first switching device and the second switching device.

Example 27. The system of examples 25-26 or any combination thereof, wherein to activate the second switching device, the circuit is configured to output, from the comparator device, a signal causing the second switching device to activate based on the magnitude of the source voltage not being lower than the magnitude of the first voltage.

Example 28. The system of examples 25-27 or any combination thereof, wherein to activate the first switching device, the circuit is configured to output, from the comparator device, a signal causing the first switching device to activate based on the magnitude of the source voltage being lower than the magnitude of the first voltage.

Example 29. The system of examples 25-28 or any combination thereof, wherein the semiconductor device and the circuit form an integrated circuit.

Example 30. The system of examples 25-29 or any combination thereof, wherein the semiconductor device is a discrete semiconductor device electrically connected to the circuit.

Various examples of the disclosure have been described. These and other examples are within the scope of the following claims.

What is claimed is:

1. A circuit for controlling a semiconductor device, the circuit comprising:
    a first switching device; and
    a second switching device, wherein the circuit is configured to:
        activate, in response to a source voltage of the semiconductor device being lower than a first voltage, the first switching device in order to cause the circuit to deliver a first electrical signal to the semiconductor device, wherein the first electrical signal comprises the first voltage;
        deactivate the first switching device in response to the source voltage of the semiconductor device not being lower than the first voltage;
        activate, in response to the source voltage of the semiconductor device not being lower than the first voltage, the second switching device to cause the circuit to deliver a second electrical signal to the semiconductor device, wherein the second electrical signal comprises a second voltage which is different from the first voltage; and
        deactivate the second switching device in response to the source voltage of the semiconductor device being lower than the first voltage,
    wherein the circuit further comprises a comparator device configured to:
        receive the first electrical signal comprising the first voltage;
        receive, from the semiconductor device, a source signal comprising the source voltage; and
        compare a magnitude of the first voltage with a magnitude of the source voltage in order to control the first switching device and the second switching device.

2. The circuit of claim 1, wherein to activate the second switching device, the circuit is configured to output, from the comparator device, a signal causing the second switching device to activate based on the magnitude of the source voltage not being lower than the magnitude of the first voltage.

3. The circuit of claim 1, wherein to activate the first switching device, the circuit is configured to output, from the comparator device, a signal causing the first switching device to activate based on the magnitude of the source voltage being lower than the magnitude of the first voltage.

4. The circuit of claim 1, wherein the circuit is further configured to:
    determine, in response to a transition of the source voltage from being lower than the first voltage to being equal to the first voltage, that a Miller plateau has occurred;
    activate the second switching device in response to determining that the Miller plateau has occurred; and
    deactivate the first switching device in response to determining that the Miller plateau has occurred.

5. The circuit of claim 1, wherein the circuit further comprises a power converter device configured to:
    receive, from a power source, a power source signal including a power source voltage; and
    generate, using the power source signal, the first electrical signal comprising the first voltage and a first current.

6. The circuit of claim 5, wherein to generate the first electrical signal, the power converter device is configured to:
    boost the power source voltage in response to the power source voltage being lower than a threshold power source voltage; and
    buck the power source voltage in response to the power source voltage not being lower than the threshold power source voltage.

7. The circuit of claim 5, wherein the power converter device is further configured to:
    regulate the first voltage of the first electrical signal to be within a target voltage range including a target voltage value.

8. The circuit of claim 7, wherein the target voltage range extends from 15 Volts (V) to 25 V, and wherein the target voltage value comprises 18V.

9. The circuit of claim 5, wherein the circuit further comprises a charge pump device configured to:
    receive, from the power source, the power source signal including the power source voltage;
    receive, from the power converter device, the first electrical signal comprising the first voltage and the first current; and
    generate, using the power source signal and the first electrical signal, the second electrical signal comprising the second voltage and a second current.

10. The circuit of claim 9, wherein to generate the second electrical signal, the charge pump device is configured to:
    boost the first voltage to generate the second electrical signal including the second voltage, wherein the second voltage is lower than the first voltage.

11. The circuit of claim 10, wherein the first set of semiconductor devices comprises within a range from one semiconductor device to three semiconductor devices, and wherein the second set of semiconductor devices comprises within a range from one semiconductor device to three semiconductor devices.

12. The circuit of claim 9, wherein the circuit further comprises:
a first set of semiconductor devices including the semiconductor device, wherein each semiconductor device of the first set of semiconductor devices are positioned between the power source and a load; and
a second set of semiconductor devices, wherein the load is positioned between the power source and each semiconductor device of the second set of semiconductor devices, and wherein the first set of semiconductor devices and the second set of semiconductor devices are configured to:
deliver at least a portion of the power source signal to the load.

13. A method comprising:
activating, by a circuit in response to a source voltage of a semiconductor device being lower than a first voltage, a first switching device in order to cause the circuit to deliver a first electrical signal to the semiconductor device, wherein the first electrical signal comprises the first voltage;
deactivating, by the circuit, the first switching device in response to the source voltage of the semiconductor device not being lower than the first voltage;
activating, by the circuit in response to the source voltage of the semiconductor device not being lower than the first voltage, a second switching device to cause the circuit to deliver a second electrical signal to the semiconductor device, wherein the second electrical signal comprises a second voltage which is different from the first voltage; and
deactivating, by the circuit, the second switching device in response to the source voltage of the semiconductor device being lower than the first voltage;
receiving, by a comparator device of the circuit, the first electrical signal comprising the first voltage;
receiving, by the comparator device, a source signal comprising the source voltage from the semiconductor device; and
comparing, by the comparator device, a magnitude of the first voltage with a magnitude of the source voltage in order to control the first switching device and the second switching device.

14. The method of claim 13, wherein activating the second switching device comprises outputting, from the comparator device, a signal causing the second switching device to activate based on the magnitude of the source voltage not being lower than the magnitude of the first voltage.

15. The method of claim 13, wherein activating the first switching device comprises outputting, from the comparator device, a signal causing the first switching device to activate based on the magnitude of the source voltage being lower than the magnitude of the first voltage.

16. The method of claim 13, wherein the method further comprises:
determining, in response to a transition of the source voltage from being lower than the first voltage to being equal to the first voltage, that a Miller plateau has occurred;
activating the second switching device in response to determining that the Miller plateau has occurred; and
deactivating the first switching device in response to determining that the Miller plateau has occurred.

17. The method of claim 13, wherein the method further comprises:
receiving, by a power converter device of the circuit, a power source signal including a power source voltage from a power source; and
generating, by the power converter device using the power source signal, the first electrical signal comprising the first voltage and a first current.

18. The method of claim 17, wherein generating the first electrical signal comprises:
boosting the power source voltage in response to the power source voltage being lower than a threshold power source voltage; and
bucking the power source voltage in response to the power source voltage not being lower than the threshold power source voltage.

19. The method of claim 17, wherein the method further comprises:
regulating, using the power converter device, the first voltage of the first electrical signal to be within a target voltage range including a target voltage value.

20. The method of claim 17, wherein the method further comprises:
receiving, by a charge pump device, the power source signal including the power source voltage from the power source;
receiving, by the charge pump device, the first electrical signal comprising the first voltage and the first current from the power converter device; and
generating, by the charge pump device using the power source signal and the first electrical signal, the second electrical signal comprising the second voltage and a second current.

21. The method of claim 20, wherein generating the second electrical signal comprises:
boosting the first voltage to generate the second electrical signal including the second voltage.

22. The method of claim 20, wherein the circuit further comprises:
a first set of semiconductor devices including the semiconductor device, wherein each semiconductor device of the first set of semiconductor devices are positioned between the power source and a load; and
a second set of semiconductor devices, wherein the load is positioned between the power source and each semiconductor device of the second set of semiconductor devices, and wherein the method further comprises:
delivering, using the first set of semiconductor devices and the second set of semiconductor devices, at least a portion of the power source signal to the load.

23. A system comprising:
a semiconductor device comprising a gate, wherein the semiconductor device is configured to receive, from a power source, a power source signal including a power source voltage; and
a circuit comprising a first switching device and a second switching device, wherein the circuit is configured to:
activate, in response to a source voltage of the semiconductor device being lower than a first voltage, the first switching device in order to cause the circuit to deliver a first electrical signal to the gate of the semiconductor device, wherein the first electrical signal comprises the first voltage;
deactivate the first switching device in response to the source voltage of the semiconductor device not being lower than the first voltage;
activate, in response to the source voltage of the semiconductor device not being lower than the first voltage, the second switching device to cause the circuit to deliver a second electrical signal to the gate of the semiconductor device, wherein the second electrical signal comprises a second voltage which is different from the first voltage; and deactivate the second switching device in response to the source voltage of the semiconductor device being lower than the first voltage, wherein the circuit further comprises a comparator device configured to:

receive the first electrical signal comprising the first voltage;

receive, from the semiconductor device, a source signal comprising the source voltage; and compare a magnitude of the first voltage with a magnitude of the source voltage in order to control the first switching device and the second switching device.

24. The system of claim 23, wherein to activate the second switching device, the circuit is configured to output, from the comparator device, a signal causing the second switching device to activate based on the magnitude of the source voltage not being lower than the magnitude of the first voltage.

25. The system of claim 23, wherein to activate the first switching device, the circuit is configured to output, from the comparator device, a signal causing the first switching device to activate based on the magnitude of the source voltage being lower than the magnitude of the first voltage.

26. The system of claim 23, wherein the semiconductor device and the circuit form an integrated circuit.

27. The system of claim 23, wherein the semiconductor device is a discrete semiconductor device electrically connected to the circuit.

28. A circuit for controlling a semiconductor device, the circuit comprising:

a first switching device; and a second switching device, wherein the circuit is configured to:

activate, in response to a source voltage of the semiconductor device being lower than a first voltage, the first switching device in order to cause the circuit to deliver a first electrical signal to the semiconductor device, wherein the first electrical signal comprises the first voltage;

deactivate the first switching device in response to the source voltage of the semiconductor device not being lower than the first voltage;

activate, in response to the source voltage of the semiconductor device not being lower than the first voltage, the second switching device to cause the circuit to deliver a second electrical signal to the semiconductor device, wherein the second electrical signal comprises a second voltage which is different from the first voltage; and deactivate the second switching device in response to the source voltage of the semiconductor device being lower than the first voltage, wherein the circuit is further configured to:

determine, in response to a transition of the source voltage from being lower than the first voltage to being equal to the first voltage, that a Miller plateau has occurred;

activate the second switching device in response to determining that the Miller plateau has occurred; and deactivate the first switching device in response to determining that the Miller plateau has occurred.

29. A circuit for controlling a semiconductor device, the circuit comprising:

a first switching device;

a power converter device configured to:

receive, from a power source, a power source signal including a power source voltage; and generate, using the power source signal, a first electrical signal comprising a first voltage;

a charge pump device configured to:

receive, from the power source, the power source signal including the power source voltage;

receive, from the power converter device, the first electrical signal comprising the first voltage; and generate, using the power source signal and the first electrical signal, a second electrical signal comprising a second voltage; and a second switching device, wherein the circuit is configured to:

activate, in response to a source voltage of the semiconductor device being lower than the first voltage, the first switching device in order to cause the circuit to deliver the first electrical signal to the semiconductor device, wherein the first electrical signal comprises the first voltage;

deactivate the first switching device in response to the source voltage of the semiconductor device not being lower than the first voltage;

activate, in response to the source voltage of the semiconductor device not being lower than the first voltage, the second switching device to cause the circuit to deliver the second electrical signal to the semiconductor device, wherein the second electrical signal comprises the second voltage which is different from the first voltage; and deactivate the second switching device in response to the source voltage of the semiconductor device being lower than the first voltage.

* * * * *